United States Patent
Han et al.

(10) Patent No.: US 8,719,682 B2
(45) Date of Patent: May 6, 2014

(54) ADAPTIVE CALIBRATION OF NOISE PREDICTIVE FINITE IMPULSE RESPONSE FILTER

(75) Inventors: Yang Han, Sunnyvale, CA (US); Shaohua Yang, San Jose, CA (US); Fan Zhang, Milpitas, CA (US); Zongwang Li, San Jose, CA (US); Changyou Xu, Fremont, CA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 13/525,182

(22) Filed: Jun. 15, 2012

(65) Prior Publication Data

US 2013/0339827 A1    Dec. 19, 2013

(51) Int. Cl.
 *G06F 11/07* (2006.01)
(52) U.S. Cl.
 USPC .......................................... 714/799
(58) Field of Classification Search
 USPC .......................................... 714/799
 See application file for complete search history.

(56) References Cited

U.S. PATENT DOCUMENTS

| | | | |
|---|---|---|---|
| 5,818,370 A * | 10/1998 | Sooch et al. | 341/120 |
| 5,838,270 A * | 11/1998 | Kiriaki | 341/143 |
| 6,304,071 B1 * | 10/2001 | Popplewell et al. | 324/76.58 |
| 6,337,564 B2 * | 1/2002 | Manzini et al. | 324/71.4 |
| 6,407,685 B1 * | 6/2002 | Handel et al. | 341/120 |
| 6,535,553 B1 | 3/2003 | Limberg et al. | |
| 7,130,344 B2 * | 10/2006 | Xia et al. | 375/233 |
| 7,248,630 B2 | 7/2007 | Modrie | |
| 7,257,764 B2 | 8/2007 | Suzuki | |
| 7,421,017 B2 | 9/2008 | Takatsu | |
| 7,502,189 B2 | 3/2009 | Sawaguchi | |
| 7,577,187 B2 * | 8/2009 | Bui | 375/148 |
| 7,702,991 B2 * | 4/2010 | Haratsch | 714/796 |
| 7,715,471 B2 | 5/2010 | Werner | |
| 8,018,360 B2 | 9/2011 | Nayak | |
| 8,046,666 B2 | 10/2011 | Park et al. | |
| 8,055,977 B2 * | 11/2011 | Ito | 714/758 |
| 8,208,213 B2 | 6/2012 | Liu et al. | |
| 8,307,248 B2 * | 11/2012 | Johansson et al. | 714/704 |
| 8,468,437 B2 * | 6/2013 | Zhang et al. | 714/799 |
| 2005/0213652 A1 * | 9/2005 | Higashino | 375/233 |
| 2006/0123285 A1 | 6/2006 | De Araujo | |

(Continued)

OTHER PUBLICATIONS

U.S. Appl. No. 13/491,062, Unpublished (filed Jun. 7, 2012) (Jin Lu).

(Continued)

*Primary Examiner* — James C Kerveros
(74) *Attorney, Agent, or Firm* — Hamilton DeSanctis & Cha

(57) ABSTRACT

Various embodiments of the present inventions are related to adaptive calibration of NPFIR filters in a data detector. For example, an apparatus for calibrating a noise predictive filter is disclosed, including a data detector operable to generate detected values for data sectors and having an embedded noise predictive finite impulse response filter. The apparatus also includes a comparator operable to determine whether a quality metric for a current one of the data sectors meets a noise threshold. The apparatus also includes a filter calibration circuit operable to adapt a number of filter coefficients for the noise predictive finite impulse response filter based on the detected values for the data sectors, and to omit the detected values for the current one of the data sectors from adaptation for one of the filter coefficients if the quality metric for the current one of the data sectors does not meet the noise threshold.

21 Claims, 4 Drawing Sheets

(56) References Cited

U.S. PATENT DOCUMENTS

| | | |
|---|---|---|
| 2009/0002862 A1 | 1/2009 | Park et al. |
| 2011/0072335 A1 | 3/2011 | Liu et al. |
| 2011/0075569 A1 | 3/2011 | Marrow |
| 2011/0164332 A1 | 7/2011 | Cao |
| 2011/0167227 A1 | 7/2011 | Yang et al. |
| 2012/0019946 A1 | 1/2012 | Aravind |
| 2012/0056612 A1 | 3/2012 | Mathew |
| 2012/0069891 A1 | 3/2012 | Zhang |
| 2012/0124119 A1 | 5/2012 | Yang |
| 2012/0201112 A1* | 8/2012 | Miyashita et al. ......... 369/53.31 |
| 2012/0207201 A1* | 8/2012 | Xia et al. ...................... 375/232 |
| 2012/0236430 A1 | 9/2012 | Tan |

OTHER PUBLICATIONS

U.S. Appl. No. 13/346,556, Unpublished (filed Jan. 9, 2012) (Haitao Xia).

U.S. Appl. No. 13/272,209, Unpublished (filed Oct. 12, 2011) (Yu Liao).

U.S. Appl. No. 13/239,719, Unpublished (filed Sep. 22, 2011) (Haitao Xia).

\* cited by examiner

ADAPTIVE CALIBRATION OF NOISE PREDICTIVE FINITE IMPULSE RESPONSE FILTER

BACKGROUND

Various data processing systems have been developed for use in applications such as storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of data processors have been developed to detect and correct errors in digital data. For example, data detectors and decoders such as Maximum a Posteriori (MAP) detectors and Low Density Parity Check (LDPC) decoder may be used to detect and decode the values of data bits or multi-bit symbols retrieved from storage or transmission systems.

Sectors of data from storage systems or other blocks of data may vary in the signal to noise ratio (SNR) and thus in the difficulty of recovering the original data after storage or transmission. Data detectors such as Soft Output Viterbi Algorithm (SOVA) detectors may include Noise Predictive Finite Impulse Response (NPFIR) filters to improve data detection of noisy data sectors. An example NPFIR filter that may be embedded in a detector trellis is disclosed in FIG. 1. The NPFIR filter applies a mathematical operation to a digital data stream to achieve any of a wide range of desired frequency responses. The NPFIR is noise predictive because the filter or tap coefficients are tuned based on the expected noise.

As illustrated in FIG. 1, the NPFIR filter 100 passes an input 102 through a series of delay elements 104, 106 and 110, multiplying the delayed signals by filter coefficients or tap weights 112, 114, 116 and 120, and summing the results to yield a filtered output 122. The outputs 130, 140 and 150 of each delay element 104, 106 and 110 and the input 102 form a tapped delay line and are referred to as taps. The number of delay elements 104, 106 and 110, and thus the number of taps 102, 130, 140 and 150 (also referred to as the order or length of the NPFIR filter 100) may be increased to more finely tune the frequency response, but at the cost of increasing complexity. The NPFIR filter 100 implements a filtering equation such as $Y[n]=F_0X[n]+F_1X[n-1]+F_2X[n-2]+F_3X[n-3]$ for the three-delay filter illustrated in FIG. 1, or more generally $Y[n]=F_0X[n]+F_1X[n-1]+F_2X[n-2]+\ldots+F_3X[n-L]$, where $X[n]$ is the current input 102, the value subtracted from n represents the index or delay applied to each term, $F_i$ are the tap weights 112, 114, 116 and 120, $Y[n]$ is the output 122 and L is the filter order. The input 102 is multiplied by tap weight 112 in a multiplier 124, yielding a first output term 126. The second tap 130 is multiplied by tap weight 114 in multiplier 132, yielding a second output term 134, which is combined with first output term 126 in an adder 136 to yield a first sum 148. The third tap 140 is multiplied by tap weight 116 in multiplier 142, yielding a third output term 144, which is combined with first sum 148 in adder 146 to yield a second sum 158. The fourth tap 150 is multiplied by tap weight 120 in multiplier 152, yielding a fourth output term 154, which is combined with second sum 158 in adder 156 to yield output 122. By changing the tap weights 25 112, 114, 116 and 120, the filtering applied to the input 102 by the NPFIR filter 100 is adjusted to select the desired pass frequencies and stop frequencies.

Multiple NPFIR filters may be embedded in a trellis-based SOVA data detector, with different NPFIR filters being selected based on the path taken through the trellis. The filter coefficients of such NPFIR filters are initially tuned based on expected noise statistics for the data sectors, but may be less effective than desired if the noise statistics are different than expected.

BRIEF SUMMARY

Various embodiments of the present inventions are related to adaptive calibration of NPFIR filters in a data detector. A noise predictive calibration circuit adaptively trains and loads multiple sets of NPFIR filter coefficients for data sectors with varying quality. Sector quality metrics are used to select data sectors when training the sets of filter coefficients and to selectively load the coefficients into system devices such as SOVA detectors with embedded NPFIR filters, or standalone NPFIR filters. Sectors classified as good can thus be filtered using NPFIR coefficients trained using good sectors, and sectors classified as noisy can be filtered using NPFIR coefficients trained using noisy sectors. The multiple sets of NPFIR filter coefficients provide improved handling of time-varying channel noise conditions.

This summary provides only a general outline of some embodiments according to the present inventions. Many other objects, features, advantages and other embodiments of the present inventions will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components.

DETAILED DESCRIPTION OF THE INVENTION

Various embodiments of the present inventions are related to adaptive calibration of NPFIR filters in a data detector. A noise predictive calibration circuit adaptively trains and loads multiple sets of NPFIR filter coefficients for data sectors with varying quality. Sector quality metrics are used to select data sectors when training the sets of filter coefficients and to selectively load the coefficients into system devices such as SOVA detectors with embedded NPFIR filters, or standalone NPFIR filters. Sectors classified as good can thus be filtered using NPFIR coefficients trained using good sectors, and sectors classified as noisy can be filtered using NPFIR coefficients trained using noisy sectors. In other embodiments, some NPFIR coefficients are trained using good sectors, and other NPFIR coefficients are trained using all sectors, regardless of quality. The multiple sets of NPFIR filter coefficients provide improved handling of time-varying channel noise conditions.

The adaptive noise predictive calibration circuit disclosed herein is applicable to processing data stored in or transmitted over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives. For example, the data processing system may be, but is not limited to, a read channel in a magnetic hard disk drive, detecting and decoding data sectors from the drive.

The term "sector" is used herein with respect to several example embodiments, but may be considered to refer generally to a block of data processed in a data processing system with retained sector reprocessing, regardless of the source or format of the data.

Figure 1:
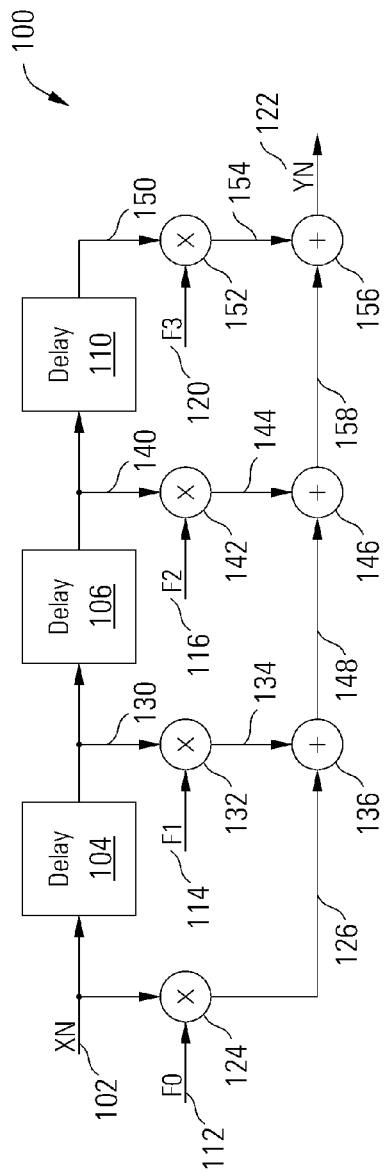
FIG. 1 depicts a prior art finite impulse response filter that may be embedded in a data detector as a noise predictive filter.
Figure 2:
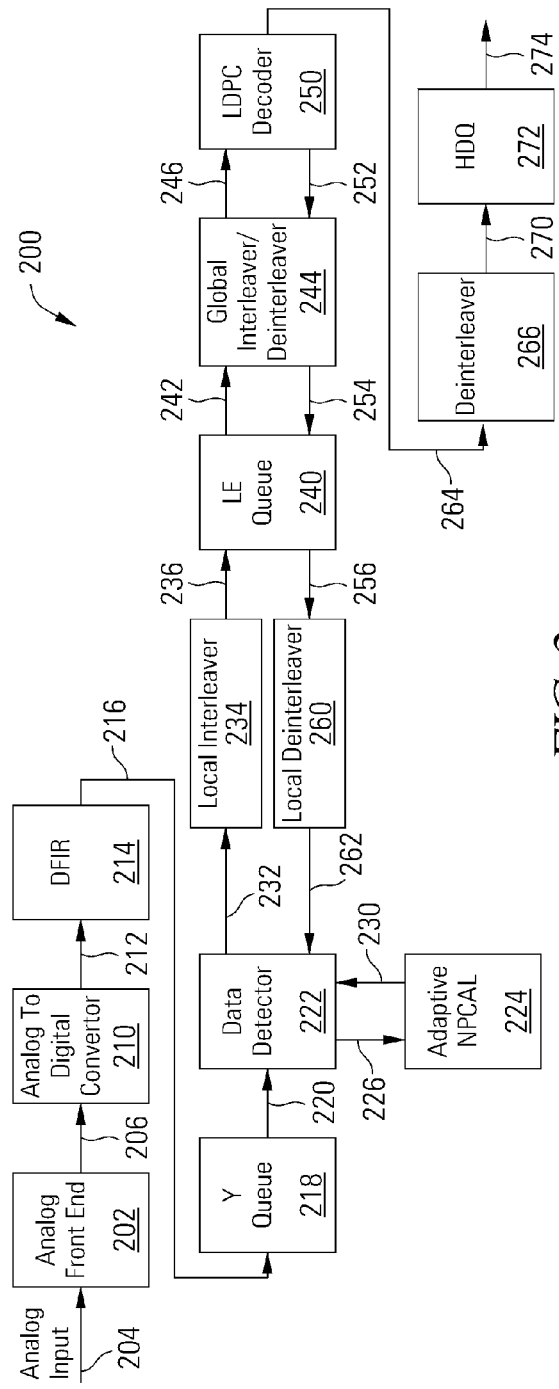
FIG. 2 depicts a block diagram of a read channel with an adaptive noise predictive calibration circuit in accordance with some embodiments of the present inventions.

Turning to FIG. 2, a read channel 200 with adaptive noise predictive filter calibration circuit or adaptive NPCAL 224 is depicted in accordance with one or more embodiments of the present inventions. Read channel 200 includes an analog front end circuit 202 that receives an analog signal 204. Analog front end circuit 202 processes analog signal 204 and provides a processed analog signal 206 to an analog to digital converter circuit 210. Analog front end circuit 202 may include, but is not limited to, an analog filter and an amplifier circuit as are known in the art. Based upon the disclosure provided herein, one of ordinary skill in the art will recognize a variety of circuitry that may be included as part of analog front end circuit 202. In some cases, analog signal 204 is derived from a read/write head assembly that is disposed in relation to a storage medium. In other cases, analog signal 204 is derived from a receiver circuit that is operable to receive a signal from a transmission medium. The transmission medium may be wired or wireless. Based upon the disclosure provided herein, one of ordinary skill in the art will recognize a variety of sources from which analog input 204 may be derived.

Analog to digital converter circuit 210 converts processed analog signal 206 into a corresponding series of digital samples 212. Analog to digital converter circuit 210 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present inventions. Digital samples 212 are provided to an equalizer circuit 214. Equalizer circuit 214 applies an equalization algorithm to digital samples 212 to reduce inter-symbol interference (ISI) based on a target response or partial response (PR) target, yielding an equalized output 216. In some embodiments of the present inventions, equalizer circuit 214 is a digital finite impulse response filter circuit as are known in the art. It may be possible that equalized output 216 may be received directly from a storage device in, for example, a solid state storage system. In such cases, analog front end circuit 202, analog to digital converter circuit 210 and equalizer circuit 214 may be eliminated where the data is received as a digital data input. Equalized output 216 is stored in Y queue 218, a memory or buffer operable to store equalized output 216 until a data detector 222 is available.

Data detector 222 is operable to apply a data detection algorithm to a received codeword or data set, and in some cases data detector 222 can process two or more codewords in parallel. In some embodiments of the present inventions, data detector 222 is a soft output Viterbi algorithm (SOVA) data detector circuit as is known in the art. The data detector 222 yields an output 232 that may be presented as non-return to zero (nrz) data, and that may include hard decisions along with soft data. The hard decisions are the most likely data values detected in data detector 222 based on Y samples 220 from Y queue 218. As used herein, the phrase "soft data" is used in its broadest sense to mean reliability data with each instance of the reliability data indicating a likelihood that a corresponding bit position or group of bit positions has been correctly detected. In some embodiments of the present inventions, the soft data or reliability data is log likelihood ratio data as is known in the art.

In other embodiments of the present inventions, data detector 222 is a maximum a posteriori data detector circuit as is known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present inventions. Data detector 222 is started based upon availability of Y samples 220 from equalizer circuit 214 via Y queue 218 (new input data sectors) or from a central memory circuit or LE queue 240 (data sectors undergoing a second or later global detection and decoding iteration).

The data detector 222 is a trellis-based data processor that includes data-dependent noise predictive finite impulse response (NPFIR) filtering. Based on the detected data or path through the trellis, different sets of tap coefficients are selected, adapting the NPFIR filter to the data. An adaptive noise predictive calibration circuit or adaptive NPCAL 224 is provided in the read channel 200 to calculate multiple sets of tap coefficients, using data sectors as training data to generate the tap coefficients. The adaptive NPCAL 224 uses quality metrics for the training data sectors, both when generating the sets of tap coefficients and when selecting the generated tap coefficients to be loaded in the NPFIRs in the data detector 222. Notably, the read channel 200 may include multiple data detectors (e.g., 222) having embedded NPFIRs, or may include standalone NPFIRs, that are configured with tap coefficients generated by the adaptive NPCAL 224. For example, a front end detector having embedded NPFIRs may be included in the adaptive NPCAL 224. The adaptive NPCAL 224 may receive input 226 from the data detector 222, including Y samples 220 and hard decisions generated in data detector 222, yielding tap coefficients 230 to be loaded in data detector 222 and other noise predictive filters in the read channel 200.

When detection is complete, data detector 222 provides detected output 232. Detected output 222 is provided to a local interleaver circuit 234. Local interleaver circuit 234 is operable to shuffle sub-portions (i.e., local chunks) of the data set included as detected output 232 and provides an interleaved codeword 236 that is stored to central memory circuit or LE queue 240. Interleaver circuit 234 may be any circuit known in the art that is capable of shuffling data sets to yield a rearranged data set. Interleaved codeword 236 is stored to LE queue 240. The interleaved codeword 226 is accessed from LE queue 240 as a stored codeword 242 and globally interleaved by a global interleaver/de-interleaver circuit 244. Global interleaver/De-interleaver circuit 244 may be any circuit known in the art that is capable of globally rearranging codewords. Global interleaver/de-interleaver circuit 244 provides a decoder input 246 to a low density parity check (LDPC) decoder 250. Based upon the disclosure provided herein, one of ordinary skill in the art will recognize other decode algorithms that may be used in relation to different embodiments of the present inventions. The LDPC decoder 250 applies a data decode algorithm to decoder input 246 in a variable number of local iterations.

Where the LDPC decoder 250 fails to converge (i.e., fails to yield the originally written data set) and a number of local iterations through LDPC decoder 250 exceeds a threshold, the resulting decoded output is provided as a decoded output 252 back to LE queue 240 where it is stored awaiting another global iteration through data detector 222 and LDPC decoder 250. Multiple sectors may be processed simultaneously in the read channel 200, with additional sectors being admitted to the data detector 222 as other sectors converge in the LDPC decoder 250 and are output and cleared from the Y queue 218 and LE queue 240.

Prior to storage of decoded output 252 to LE queue 240, decoded output 252 is globally de-interleaved to yield a globally de-interleaved output 254 that is stored to LE queue 240. The global de-interleaving reverses the global interleaving earlier applied to stored codeword 242 to yield decoder input 246. Once data detector 222 is available, a previously stored de-interleaved output 256 is accessed from LE queue 240 and locally de-interleaved by a de-interleaver circuit 260. De-interleaver circuit 260 re-arranges stored decoder output 256 to reverse the shuffling originally performed by interleaver circuit 234. A resulting de-interleaved output 262 is provided to data detector 222 where it is used to guide subsequent detection of a corresponding data set received as equalized output 216.

Alternatively, where the decoded output converges (i.e., yields the originally written data set) in the LDPC decoder 250, the resulting hard decision or decoded output is provided as an output codeword 264 to a de-interleaver circuit 266. De-interleaver circuit 266 rearranges the data to reverse both the global and local interleaving applied to the data to yield a de-interleaved output 270. De-interleaved hard decision output 270 is stored in hard decision queue (HDQ) 272 and produced at output 274. The hard decisions at output 274 may be received, for example, by a hard disk controller circuit which initiates read operations of a magnetic storage device and which receives the resulting data and provides it to an external device such as a general purpose computer system.

Figure 3:
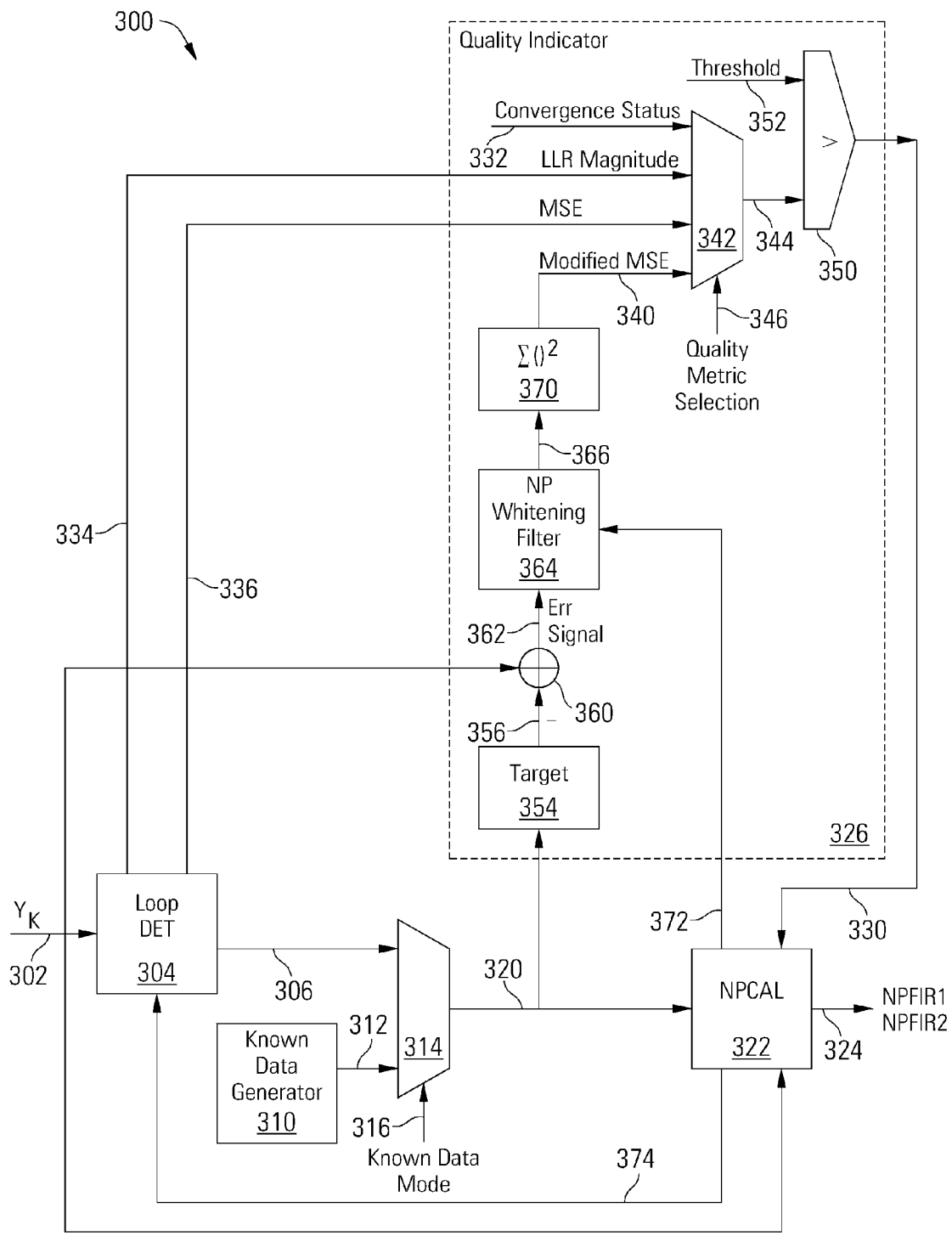
FIG. 3 depicts a block diagram of an adaptive noise predictive calibration circuit in accordance with some embodiments of the present inventions.

Turning to FIG. 3, an adaptive noise predictive filter calibration circuit or adaptive NPCAL 300 is disclosed in accordance with some embodiments of the present inventions. The adaptive NPCAL 300 generates multiple sets of noise predictive filter coefficients 324. In the example of FIG. 3, the adaptive NPCAL 300 generates two sets of noise predictive filter coefficients 324 NPFIR1 and NPFIR2. The first set NPFIR1 is generated in a noise predictive calibration circuit NPCAL 322 based on the hard decisions from a front end SOVA detector 304 or loop detector for all data sectors as they are read, the second set NPFIR2 is generated in NPCAL 322 based only on data sectors with relatively good quality (or low noise). In other embodiments, the multiple sets of noise predictive filter coefficients 324 may be based on good (low noise) sectors for one set NPFIR1 and bad (noisy) sectors for another set NPFIR2.

The NPCAL 322 may generate noise predictive filter coefficients 324 in any suitable manner, for example as disclosed in US Patent Application Publication 2011/0072335 for "Branch-Metric Calibration Using Varying Bandwidth Values", filed Sep. 18, 2009, which is incorporated herein for all purposes. The filter coefficients 324 generated by NPCAL 322 are data dependent, and a set of filter coefficients contains multiple coefficients, one for each path through the detector trellis at a given time. For example, in a detector trellis with 3-bit states, the data detector may have any of 8 values for a given 3-bit state, and one of eight filter coefficients are selected from the set of filter coefficients based on the 3-bit state. The first state 000 would select the first filter coefficients $f_0$, the second state 001 would select the second filter coefficients $f_1$, and so on up to the eighth state 111 which would select the eight filter coefficients $f_7$.

The adaptive NPCAL 300 receives Y samples 302 for data sectors to be processed in data detector 304. In some embodiments, data detector 304 is a front end loop detector implementing a soft output Viterbi algorithm, such as a Viterbi detector or a MAP detector. Data detector 304 includes embedded noise predictive finite impulse response filters configured with the noise predictive filter coefficients 324 from NPCAL 322. Data detector 304 yields hard decisions 306 corresponding to Y samples 302. The NPCAL 322 generates the first set NPFIR1 of noise predictive filter coefficients 324 based on Y samples 302 and on the hard decisions 306 from detector 304. In some embodiments, the adaptive NPCAL 300 also provides the option of generating the first set NPFIR1 of noise predictive filter coefficients 324 in NPCAL 322 based on known data samples 312 from a known data generator 310. In these instances, a multiplexer 314 selects the known data samples 312 for use in NPCAL 322 if the system is in a known data mode 316, otherwise selecting the hard decisions 306 to generate the first set NPFIR1 of noise predictive filter coefficients 324 based on actual received data sectors.

The adaptive NPCAL 300 thus generates the first set NPFIR1 of noise predictive filter coefficients 324 in NPCAL 322 based on all data sectors received and processed in detector 304, or in some embodiments, using known data 312. The adaptive NPCAL 300 generates the second set NPFIR2 of noise predictive filter coefficients 324 in NPCAL 322 using only received data sectors that meet a quality metric, omitting noisy sectors from the filter coefficient training operation. The adaptive NPCAL 300 may use any suitable quality metric for determining whether a data sector has low enough noise statistics to be used in generating the second set NPFIR2 of noise predictive filter coefficients 324, or may select between multiple quality metrics. For example, a quality indicator circuit 326 in adaptive NPCAL 300 selects between a mean square error (MSE) signal 336 from the detector 304, a modified MSE signal 340, a log-likelihood ratio (LLR) magnitude 334 from the detector 304, or a convergence status 332 from a downstream decoder as data sector quality metrics.

The MSE signal 336 is generated in the detector 304 using, for example, any least mean squared algorithm and yielding the mean square of the difference between the received Y samples 302 and the detected value for the Y samples 302. The modified MSE signal 340 is generated outside the detector 304 using a filtered or whitened error signal by taking the mean square of the difference between the received Y samples 302 and the detected value for the Y samples 302 and using a whitening filter to increase the Euclidean distance between good and bad sectors. The LLR magnitude 334 is a measure of the confidence in the detected values or hard decisions 306 for the Y samples 302, with the confidence generally being lower for relatively noisy data sectors. The convergence status 332 indicates whether decoded values for the Y samples 302 converge in a downstream decoder such as an LDPC decoder. In general, a noisy sector is less likely to converge in the downstream decoder, thus the convergence status 332 can be used as a quality metric for the data sector.

Other quality metrics may be used in the adaptive NPCAL, with the goal of providing good correlation with channel conditions in the resulting filter coefficients 324. This may be achieved by a good margin of separation between good and bad data sectors. Then, as data sectors are processed in a read channel, they are classified by noise statistics as good or bad data sectors, and noise predictive filter coefficients 324 generated in similar conditions are loaded in data detectors or standalone NPFIR filters in the read channel.

The quality indicator circuit 326 generates a control signal 330 that freezes adaptation of the second set NPFIR2 of noise predictive filter coefficients 324 in NPCAL 322 when the current data sector does not meet the selected quality metrics, thus omitting noisy data sectors from the filter coefficient training operation for NPFIR2.

To generate the modified MSE signal 340 in the quality indicator circuit 326, the hard decisions 320 from the detector 304 (or known data samples 312) are convolved with a partial response (PR) target 354, yielding expected Y samples 356. The expected Y samples 356 are subtracted from the received Y samples 302 in a subtraction circuit 360 to yield an error signal 362 over the length of the data sector. In other words, the error signal 362 is based on the difference between the expected values 356 for the data sector and the received values 302 for the data sector. The error signal 362 is filtered in a noise predictive whitening filter 364, yielding filtered error signal 366. A mean square circuit 370 applies any type of least mean square algorithm to filtered error signal 366 to yield modified MSE signal 340. The quality indicator circuit 326 is not limited to any particular least mean square algorithm or whitening filter, and one of ordinary skill in the art will recognize a variety of techniques that may be applied to generate a modified MSE signal 340 with increased Euclidean distance between data sectors to be characterized as bad or noisy and those to be characterized as good, with the goal of increasing correlation between channel conditions and the filter coefficients 324 applied when processing a data sector.

A quality metric for the data sector is selected in quality indicator circuit 326 based on a quality metric selection signal 346. For example, multiplexer 346 is controlled by quality metric selection signal 346 to select the modified MSE signal 340, MSE signal 336, LLR magnitude 334 or convergence status 332, yielding a selected quality metric 344. The selected quality metric 344 is compared with a noise threshold 352 in comparator 350, and if the data sector is noisier than the noise threshold 352, the control signal 330 is asserted. Control signal 330 freezes adaptation of the second set NPFIR2 of tap coefficients 324 in the NPCAL 322, omitting the hard decisions 320 for the current data sector from the training procedure for NPFIR2 although they are used to adapt NPFIR1. The noise threshold 352 may be set at any level desired, whether fixed, variable, or programmable, to increase the correlation between the channel conditions for a data sector being processed and the conditions under which the filter coefficients 324 were generated. Comparator 350 may be configured to provide a suitable comparison based on the selected quality metric. For example, the MSE signal 336 and modified MSE signal 340 increase in value for noisier data sectors, and the comparator 350 is configured to assert the control signal 330 when the modified MSE signal 340 or MSE signal 336 is greater than the noise threshold 352.

When processing a data sector in a read channel (e.g., 200), the channel noise conditions are determined, for example using the quality metrics disclosed above for the data sector, and tap coefficients that were adapted in similar noise conditions are loaded in detectors (e.g., 222, 304) in the read channel 200. For example, in some embodiments, for each data sector processed in front end loop detector 304, the quality metric is used to select between the low noise or high noise filter coefficients 324, and the selection decision is stored together with a sector tag identifying the data sector. When the data sector is later processed in a back end detector (e.g., 222), the selection decision is retrieved and the corresponding set of filter coefficients 324 is loaded in the data detector 222 before processing the data sector.

Figure 4:
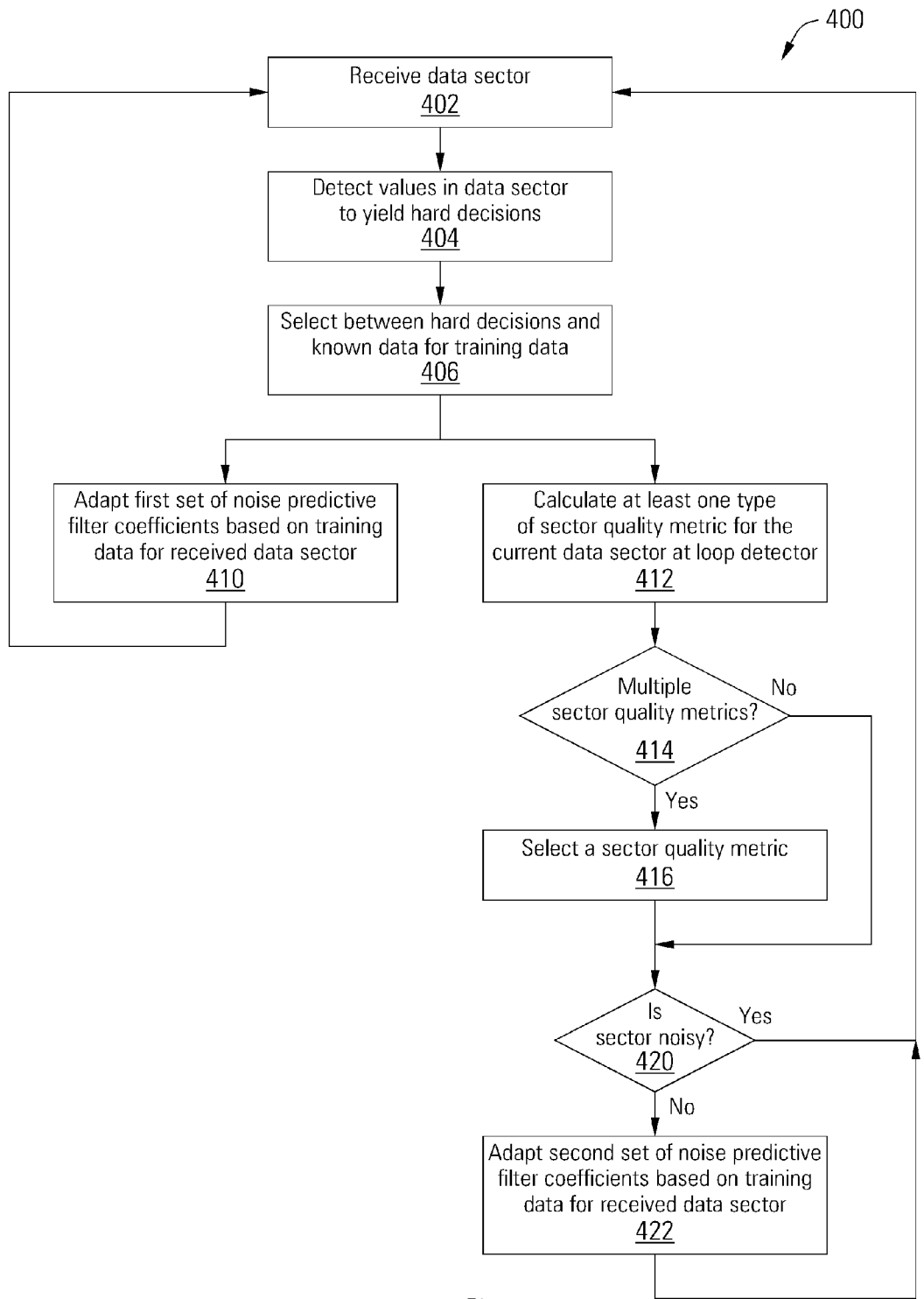
FIG. 4 depicts a flow diagram showing a method for adaptively calibrating a noise predictive finite impulse response filter based on a data sector quality metric in accordance with some embodiments of the present inventions.

Turning to FIG. 4, a flow diagram 400 depicts a method for adaptively calibrating a noise predictive finite impulse response filter based on a data sector quality metric in accordance with some embodiments of the present inventions. The method of FIG. 4 may be performed, for example by circuits such as those disclosed in FIGS. 2 and 3. Following flow diagram 400, a data sector is received for processing. (Block 402). The data sector may be read, for example, from a magnetic hard disk. Values in the data sector are detected to yield hard decisions. (Block 404) The data detection may be performed, for example, in a front end loop detector 304. A selection is made between the use of hard decisions and known data for training data. (Block 406) Such a selection may be made, for example, based on whether an adaptive NPCAL 300 is in a known data mode. A first set of noise predictive filter coefficients is adapted based on the training data for received data sector. (Block 410) At least one type of sector quality metric is calculated for the current data sector at loop detector. (Block 412) If the system includes multiple sector quality metrics (block 414), one of the sector quality metrics is selected. (Block 416) Such sector quality metrics may include, for example but not limited to, a mean square error generated by the detector, a modified mean square error generated using a noise whitening filter to increase Euclidean separation between data sectors judged to be noisy and good, LLR magnitudes output by the detector, a decoder convergence status for the data sector, etc. A determination is made as to whether the sector is noisy. (Block 420) This determination may be made using the selected sector quality metric. The quality metric may differentiate between noisy and good sectors in any manner and based on any criteria. If the sector is not noisy, a second set of noise predictive filter coefficients is adapted based on the training data for the received data sector. (Block 422) Otherwise, if the sector is noisy, the adaptation of the second set of coefficients is frozen and the data sector is omitted from the coefficient training process. The method thus uses all data sectors to train the first set of noise predictive filter coefficients, but only good quality (low noise) data sectors to train the second set of noise predictive filter coefficients.

During the data detection process, the first set of noise predictive filter coefficients are loaded when detecting values in noisy data sectors, and the second set of noise predictive filter coefficients are loaded when detecting values in low-noise data sectors. The filter coefficients are thus correlated with the noise statistics for each data sector, improving detection. Notably, although in this example embodiment, both noisy and low-noise data sectors are used to adapt or train the first set of noise predictive filter coefficients, in other embodiments the first set of noise predictive filter coefficients may be trained only using noisy data sectors.

A method for filtering data in a noise predictive filter may include providing at least one data sector to a noise predictive filter calibration circuit based on a first criterion and providing at least one other data sector to the noise predictive filter calibration circuit based on a second criterion. In some embodiments, the first criterion requires that only low-noise data sectors are provided to the noise predictive filter calibration circuit and the second criterion requires that all noise data sectors are provided to the noise predictive filter calibration circuit. In some embodiments, the second criterion requires that only high-noise data sectors are provided to the noise predictive filter calibration circuit. In the noise predictive filter calibration circuit, a first set of noise predictive filter coefficients is generated based at least in part on the at least one data sector, and a second set of noise predictive filter coefficients is generated based at least in part on the at least one other data sector. A selection is made between the first set of noise predictive filter coefficients and the second set of noise predictive filter coefficients to load in a data detector based on a quality metric for a data sector being processed in the data detector.

Figure 5:
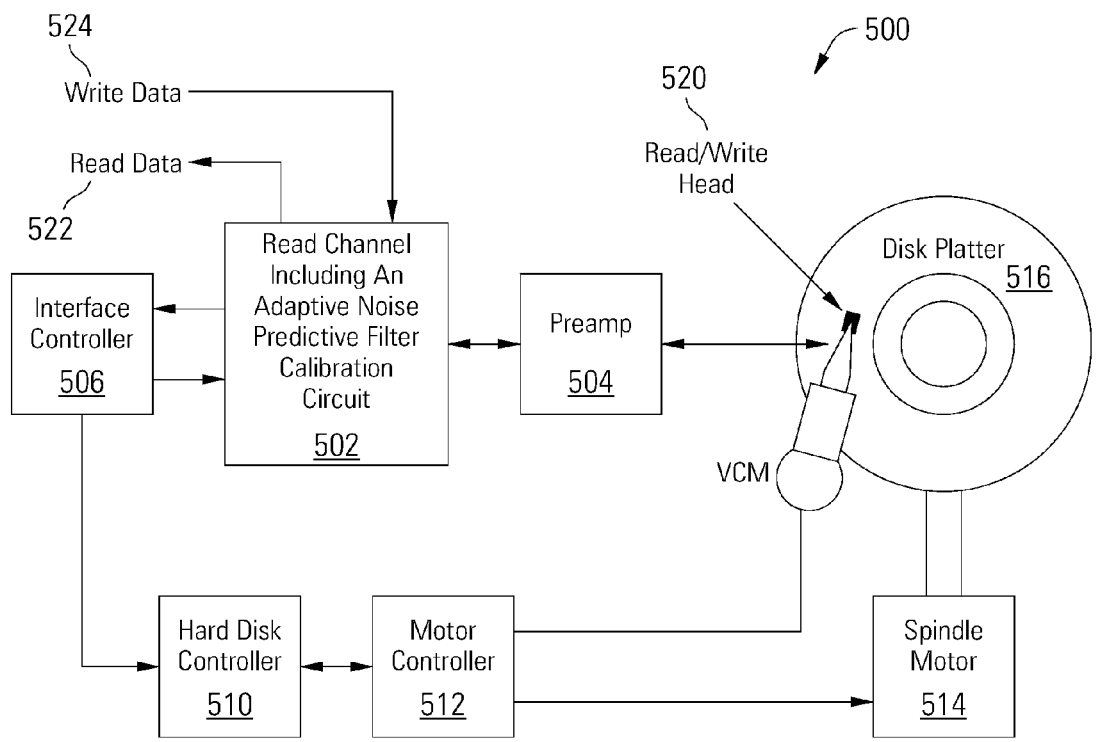
FIG. 5 depicts a storage system including an adaptive NPFIR calibration circuit in accordance with various embodiments of the present invention.
Figure 6:
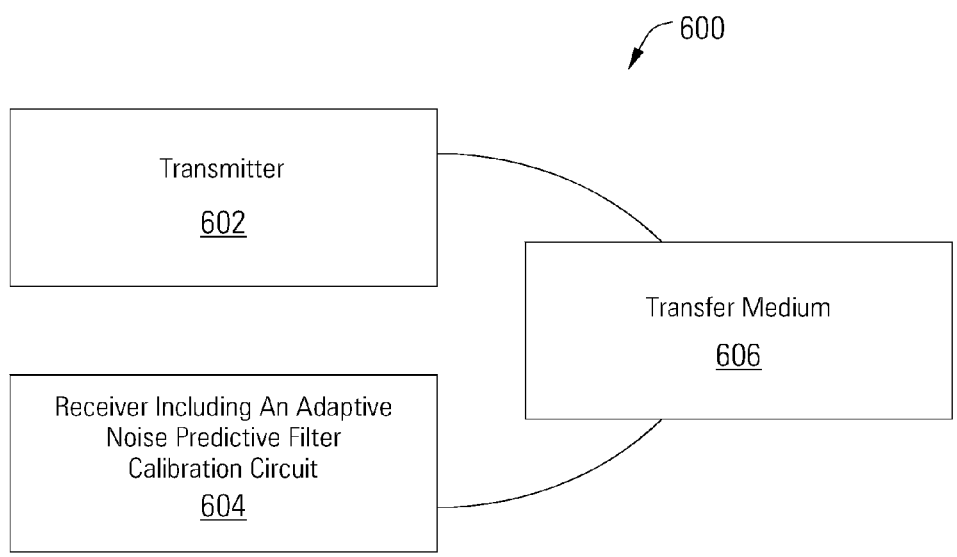
FIG. 6 depicts a wireless communication system including an adaptive NPFIR calibration circuit in accordance with various embodiments of the present invention.

Although the adaptive noise predictive filter calibration circuit or adaptive NPCAL disclosed herein is not limited to any particular application, several examples of applications are presented in FIGS. 5 and 6 that benefit from embodiments of the present invention. Turning to FIG. 5, a storage system 500 is illustrated as an example application of an adaptive NPCAL in accordance with some embodiments of the present invention. The storage system 500 includes a read channel circuit 502 with adaptive NPCAL in accordance with some embodiments of the present inventions. Storage system 500 may be, for example, a hard disk drive. Storage system 500 also includes a preamplifier 504, an interface controller 506, a hard disk controller 510, a motor controller 512, a spindle motor 514, a disk platter 516, and a read/write head assembly 520. Interface controller 506 controls addressing and timing of data to/from disk platter 516. The data on disk platter 516 consists of groups of magnetic signals that may be detected by read/write head assembly 520 when the assembly is properly positioned over disk platter 516. In one embodiment, disk platter 516 includes magnetic signals recorded in accordance with either a longitudinal or a perpendicular recording scheme.

In a typical read operation, read/write head assembly 520 is accurately positioned by motor controller 512 over a desired data track on disk platter 516. Motor controller 512 both positions read/write head assembly 520 in relation to disk platter 516 and drives spindle motor 514 by moving read/write head assembly 520 to the proper data track on disk platter 516 under the direction of hard disk controller 510. Spindle motor 514 spins disk platter 516 at a determined spin rate (RPMs). Once read/write head assembly 520 is positioned adjacent the proper data track, magnetic signals representing data on disk platter 516 are sensed by read/write head assembly 520 as disk platter 516 is rotated by spindle motor 514. The sensed magnetic signals are provided as a continuous, minute analog signal representative of the magnetic data on disk platter 516. This minute analog signal is transferred from read/write head assembly 520 to read channel circuit 502 via preamplifier 504. Preamplifier 504 is operable to amplify the minute analog signals accessed from disk platter 516. In turn, read channel circuit 502 decodes and digitizes the received analog signal to recreate the information originally written to disk platter 516. This data is provided as read data 522 to a receiving circuit. As part of decoding the received information, read channel circuit 502 processes the received signal using detectors with embedded NPFIRs, calibrated by an adaptive NPCAL. Such an adaptive NPCAL may be implemented consistent with that disclosed above in relation to FIGS. 2 and 3. In some cases, the adaptive calibration of a noise predictive finite impulse response filter may be performed consistent with the flow diagram disclosed above in relation to FIG. 4. A write operation is substantially the opposite of the preceding read operation with write data 524 being provided to read channel circuit 502. This data is then encoded and written to disk platter 516.

It should be noted that storage system 500 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 500, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Turning to FIG. 6, a wireless communication system 600 or data transmission device including a receiver 604 with an adaptive NPCAL is shown in accordance with some embodiments of the present inventions. Communication system 600 includes a transmitter 602 that is operable to transmit encoded information via a transfer medium 606 as is known in the art. The encoded data is received from transfer medium 606 by receiver 604. Receiver 604 uses a detector with embedded NPFIRs, calibrated by an adaptive NPCAL. Such an adaptive NPCAL may be implemented consistent with that disclosed above in relation to FIGS. 2 and 3. In some cases, the adaptive calibration of a noise predictive finite impulse response filter may be performed consistent with the flow diagram disclosed above in relation to FIG. 4.

It should be noted that the various blocks discussed in the above application may be implemented in integrated circuits along with other functionality. Such integrated circuits may include all of the functions of a given block, system or circuit, or a portion of the functions of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel apparatuses, systems, and methods for adaptive calibration of noise predictive filters. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus for calibrating a noise predictive filter, comprising:
a data detector operable to generate detected values for data sectors, wherein the data detector has an embedded noise predictive finite impulse response filter;
a comparator operable to determine whether a quality metric for a current one of the data sectors meets a noise threshold; and
a filter calibration circuit operable to adapt a plurality of filter coefficients for the noise predictive finite impulse response filter based on the detected values for the data sectors, and to omit the detected values for the current one of the data sectors from adaptation for one of the plurality of filter coefficients if the quality metric for the current one of the data sectors does not meet the noise threshold.

2. The apparatus of claim 1, wherein the filter calibration circuit is further operable to adapt the plurality of filter coefficients based on known data.

3. The apparatus of claim 1, wherein said one of the plurality of filter coefficients is based on the detected values for data sectors for which the quality metric meets the noise threshold.

4. The apparatus of claim 3, wherein another one of the plurality of filter coefficients is based on the detected values for all the data sectors.

5. The apparatus of claim 3, wherein another one of the plurality of filter coefficients is based on the detected values for data sectors for which the quality metric does not meet the noise threshold.

6. The apparatus of claim 1, further comprising a quality metric circuit operable to generate a modified mean square error signal as the quality metric, the quality metric circuit comprising:
a partial response target circuit operable to convolve the detected values with a partial response target to yield expected values;
a subtractor operable to subtract the expected values from input values for the data sectors to yield an error signal;
a noise predictive whitening filter operable to filter the error signal to yield a filtered error signal; and
a mean square error circuit operable to yield the modified mean square error signal based on the filtered error signal.

7. The apparatus of claim 1, wherein the quality metric comprises a mean square error signal from the data detector.

8. The apparatus of claim 1, wherein the quality metric comprises log likelihood ratio magnitude values from the data detector.

9. The apparatus of claim 1, wherein the quality metric comprises a convergence status for the current one of the data sectors from a data decoder.

10. The apparatus of claim 1, further comprising a quality metric selector operable to select between a plurality of different quality metrics.

11. The apparatus of claim 1, further comprising a filter coefficient loader operable to configure the noise predictive finite impulse response filter with one of the plurality of filter coefficients based on the quality metric.

12. The apparatus of claim 1, wherein the data detector, comparator and filter calibration circuit are implemented as an integrated circuit.

13. The apparatus of claim 1, wherein the data detector, comparator and filter calibration circuit are incorporated in a storage device.

14. The apparatus of claim 1, wherein the data detector, comparator and filter calibration circuit are incorporated in a storage system comprising a redundant array of independent disks.

15. The apparatus of claim 1, wherein the data detector, comparator and filter calibration circuit are incorporated in a transmission system.

16. A method for filtering data in a noise predictive filter, comprising:
providing at least one data sector to a noise predictive filter calibration circuit based on a first criterion;
providing at least one other data sector to the noise predictive filter calibration circuit based on a second criterion;
in the noise predictive filter calibration circuit, generating a first set of noise predictive filter coefficients based at least in part on the at least one data sector;
in the noise predictive filter calibration circuit, generating a second set of noise predictive filter coefficients based at least in part on the at least one other data sector; and
selecting between the first set of noise predictive filter coefficients and the second set of noise predictive filter coefficients to load in a data detector based on a quality metric for a data sector being processed in the data detector.

17. The method of claim 16, wherein the at least one data sector and the at least one other data sector are mutually exclusive.

18. The method of claim 16, wherein the at least one data sector and the at least one other data sector are not mutually exclusive and are not identical.

19. The method of claim 16, further comprising storing a quality metric used in the first criterion with a sector tag for use during the selecting.

20. A storage system comprising:
a storage medium maintaining a data set;
a read/write head assembly operable to sense the data set on the storage medium and to provide an analog output corresponding to the data set;
an analog to digital converter operable to sample a continuous signal to yield a digital output; and
a noise predictive filter calibration circuit, comprising:

a data detector operable to generate detected values for data sectors in the digital output, wherein the data detector has an embedded noise predictive finite impulse response filter;

a comparator operable to determine whether a quality metric for a current one of the data sectors meets a noise threshold; and a filter calibration circuit operable to adapt a plurality of filter coefficients for the noise predictive finite impulse response filter based on the detected values for the data sectors, and to omit the detected values for the current one of the data sectors from adaptation for one of the plurality of filter coefficients if the quality metric for the current one of the data sectors does not meet the noise threshold.

21. The storage system of claim 20, wherein the storage medium comprises a redundant array of independent disks.

\* \* \* \* \*